United States Patent [19]
Ma

[11] Patent Number: 5,373,514
[45] Date of Patent: Dec. 13, 1994

[54] THREE-STATE BUS STRUCTURE AND METHOD FOR GENERATING TEST VECTORS WHILE AVOIDING CONTENTION AND/OR FLOATING OUTPUTS ON THE THREE-STATE BUS

[75] Inventor: Hi K. Ma, Fremont, Calif.

[73] Assignee: Synopsys, Inc., Mountain View, Calif.

[21] Appl. No.: 1,939

[22] Filed: Jan. 8, 1993

Related U.S. Application Data

[63] Continuation of Ser. No. 585,755, Sep. 20, 1990, abandoned.

[51] Int. Cl.⁵ .................... G06F 11/00; H03M 13/00
[52] U.S. Cl. ................................. 371/57.1; 371/29.5
[58] Field of Search ............. 371/57.1, 48, 27, 29.5, 371/60

[56] References Cited

U.S. PATENT DOCUMENTS

| | | | |
|---|---|---|---|
| 3,273,119 | 9/1966 | Helm | 340/146.1 |
| 4,020,460 | 4/1977 | Jones et al. | 371/57.1 |
| 4,225,959 | 9/1980 | Suelflow et al. | 371/40.1 |
| 4,945,540 | 7/1990 | Kaneko | 371/57.1 |
| 5,067,132 | 11/1991 | Blakkan | 371/52 |

Primary Examiner—Robert W. Beausoliel, Jr.
Assistant Examiner—Ly V. Hua
Attorney, Agent, or Firm—Skjerven, Morrill, MacPherson, Franklin & Friel

[57] ABSTRACT

A structure and method, useful in a test pattern generation system, for evaluating control and data input signals to a three state bus to determine whether the control input signals result in either a contention on the three state bus or floating of the three state bus is disclosed. Two parallel logic networks are used. A first logic network receives both the control input signals and data input signals and in turn generates an output signal that is the output signal of the three state bus. The second logic network receives only the control input signals and in turn generates an output signal having a first predetermined value when the bus output signal is valid and a second predetermined value when either a contention exists on the three state bus or the three state bus is floating. Selection of test vectors that produce only control signals that in turn produce an output signal from the second logic network having the first predetermined value results in selection of only valid test vectors.

10 Claims, 7 Drawing Sheets

THREE-STATE BUS STRUCTURE AND METHOD FOR GENERATING TEST VECTORS WHILE AVOIDING CONTENTION AND/OR FLOATING OUTPUTS ON THE THREE-STATE BUS

This application is a continuation of application Ser. No. 07/585,755, filed Sep. 20, 1990, now abandoned.

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field of the Invention

This invention relates generally to computer aided design systems and in particular to a network, for use with a test pattern generator of a computer aided design system, for simulating the operation of a three state bus.

2. Prior Art

A design for a digital circuit is typically tested by applying a sequence of known test vectors to the design using a computer based system. A test vector typically defines all the input signals to the circuit and the expected output signals for the given input signals. The main purpose of the test vectors is to help the designer verify that the design has been correctly manufactured.

However, for a complex circuit, the generation of test vectors is itself a very complex process. Typically, as part of a computer aided digital circuit design package, a test pattern generator is provided to automatically generate test vectors. For circuits containing three state elements, such as three state element 50 described below, test pattern generators may produce test vectors that in fact are not valid. Therefore, prior to using the test vectors, the user must validate the automatically generated test vectors. The validation may be done manually or perhaps using a simulator. In either case, validation of the test vectors for circuits containing three state elements is a time consuming process.

Three state element 50 (FIG. 1) has two input lines 10, 20, data input line 10, and control input line 20, and one output line 25. Data input line 10 is provided a data input signal D-1 with either a logic value of zero or one. When signal E-1 on control input line 20 is active, the logic level of signal D-1 is transferred through element 50 to output line 25. When signal E-1 on control input line 20 is inactive, output line 25 is at a high-impedance state. Thus, the output signal from three state element 50 can be in one of three states, logic zero, logic one, or high impedance.

In a digital circuit, three state elements are often used to construct three state busses such as bus 60 (FIG. 2). Three state elements 50-1, 50-2, ... 50-n have data input lines 10-1, 10-2 ... 10-n that carry data input signals D-1, D-2, ... D-n, respectively. Similarly, control input lines 20-1 ..., 20-n carry control input signals E-1, ... E-n, respectively.

In the digital circuit, three state bus 60 performs a multiplexing function, i.e., only one data input signal D-i is selected and appears on output line 30 as bus output signal Z. There are at least two possible states of bus 60 which are undesirable. In the first state, two or more of control input signals E are active and as a result a contention occurs on bus 60 between the output signals from the active three state elements.

In the second state, all control input signals E-1, ... E-n are inactive so that bus 60 floats at a high impedance state. Both of these states are typically unacceptable in a digital circuit.

Unfortunately, a test pattern generator in a computer based design system does not have a means for determining whether a given test vector results in either contention or floating of a three state bus. Typically, a computer-based test generation system, and therefore the test pattern generator, support a set of primitive logic elements such as AND, OR, NAND, NOR, NOT and buffer.

A digital design is represented by an interconnection of the primitive logic elements, i.e. a network within the computer system. These primitive logic elements can be used for a test pattern generator to form a structure for three state bus 60, but such a structure fails to detect either floating or contentions without examination of the test vectors. To eliminate examination of the test vectors for a three state bus in a test generation system, the test pattern generator of that system must eliminate any test patterns that result in either contentions or floating of the three state bus, i.e., the test pattern generator must produce only valid test vectors.

Since there is currently no means available to generate known valid test vectors for a circuit including a three state bus, the general recommendation is to avoid use of three state busses in a digital circuit design. However, such an approach is of no value to the digital circuit designer that wishes to use such a bus. Therefore, a means for representing a three state bus including means for assuring that a test vector does not result in either a contention or floating of the three state bus would greatly enhance the performance and versatility of computer based test generation systems.

SUMMARY OF THE INVENTION

According to the principles of this invention, a structure and a method are provided for ascertaining whether a digital circuit including a three state bus has data input signals and control input signals to the bus that result in bus contention or bus floating (contention/floating). The structure includes two networks. A first network is a logic function means that processes data input signals and control input signals for the three state bus and produces the bus output signal. A second network is a control input error detection means that processes only the three state bus control input signals and generates an output signal that changes logic state whenever the control input signals cause an undesirable condition, e.g., contention or floating (contention/floating), on the bus.

The logic function means and control input error detection means are parallel components. Both means are logic networks. Considering a three state bus having a plurality of n three state elements, both means receive n control input signals on n control input lines. However, only the logic function means, sometimes referred to as a means for simulating digital signal propagation through the three state bus, receives n data input signals on n data input lines.

The logic function means, in response to the n data input signals and n control input signals, generates an output signal on an output line which is the output signal for the three state bus for these data and control input signals.

In one embodiment, the logic function means is comprised of a plurality of primitive logic elements where each three state element in the three state bus is represented by at least one of the primitive logic elements. The at least one primitive logic element processes the control input signal and the data input signal for the three state element which it represents.

However, the logic function means cannot determine either whether the bus is floating or alternatively whether contentions exist on the bus. The allowable output signals, i.e., a logic one or zero, do not contain sufficient information to identify such conditions.

Detecting contentions/floating on the three state bus is the function of the second network in the structure of this invention, the control input error detection means. The control input error detection means, in response to the n control input signals, generates an output signal on an output line which has a first constant predetermined logic level when the control input signals to the three state bus are valid. As used herein, valid control input signals means that the set of control input signals do not result in either contentions or floating of the three state bus. When the control input signals result in either a contention or a floating condition on the three state bus, i.e., the control input signals are invalid, the output signal has a second constant predetermined logic value. The first and second constant predetermined logic values are allowable output signals from the logic primitives.

In one embodiment, the control input error detection means also includes a plurality of primitive logic elements. For the n element three state bus, the plurality of primitive logic elements includes n primitive logic elements and each primitive logic element processes n signals where the n signals are associated with the n control input signals to the three state bus.

Therefore, the structure of this invention, including the two means identifies any combination of data input and control input signals, which result in an undesired condition on the three state bus. Accordingly, any test vector that is analyzed using the structure of this invention and that produces the first constant predetermined logic level output signal from the control input error means is guaranteed not to cause either a contention or floating condition on the three state bus.

In addition to the novel structure of this invention, according to the principles of this invention, a method is provided for identifying digital circuit three state bus data input and control input signals, typically derived from a digital circuit test vector, that result in either a contention on or floating (contention/floating) of the three state bus. The first step in the method is to simulate digital logic signal propagation through the three state bus and generate the output signal of the three state bus for the given data input and control input signals. However, as explained above, this output signal does not contain sufficient information to determine whether the three state bus is floating or has contentions.

The second step in the method detects either contentions on the three state bus or a floating of the three state bus by generating, in response to the digital control input signals, a signal having (i) a first constant logic value in the absence of contentions/floating of the bus and (ii) a second constant logic value in the presence of contentions/floating of the bus.

In one embodiment, the simulating step includes generating a logic network representing the three state bus using primitive logical elements. Similarly, the detecting step includes generating a logic network that in response to the control input signals has the first constant logic value output signal when contention/floating of the bus is not present and the second constant logic value output signal when contention/floating is present on the bus.

DETAILED DESCRIPTION OF THE INVENTION

According to the principles of this invention, a structure is provided for ascertaining whether a three state bus in a digital circuit has data input signals and control input signals that result in bus contention or bus floating (contention/floating). This structure includes two networks. A first network is a logic function means that processes data input signals and control input signals for the three state bus and produces the bus output signal. A second network is a control input error detection means that processes only the three state bus control input signals and generates an output signal that changes logic state whenever the control input signals cause an undesirable condition, e.g., contention or floating, on the bus.

Figure 1:
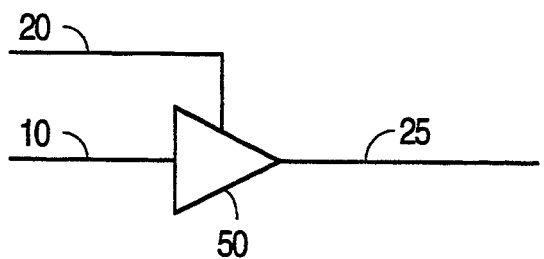
FIG. 1 is a diagram of a prior art three state element.
Figure 2:
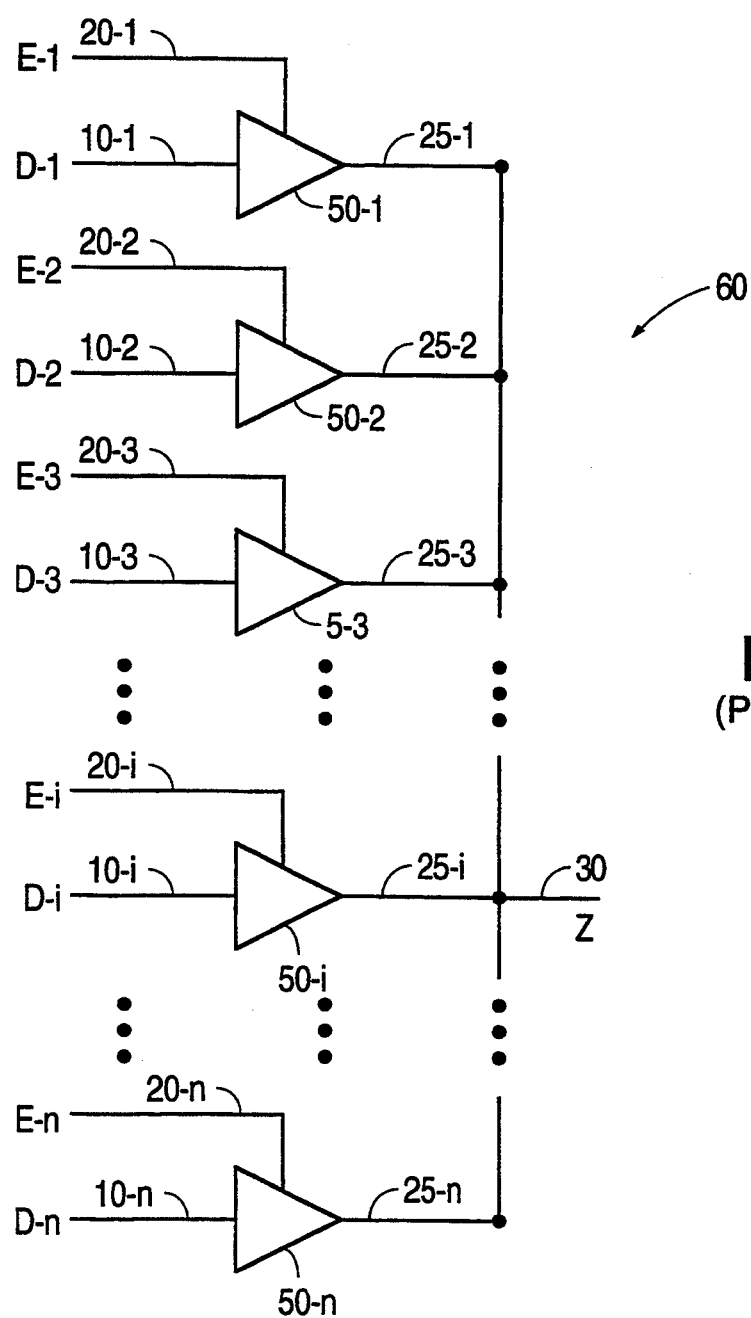
FIG. 2 is a circuit diagram for a prior art three state bus.
Figure 3:
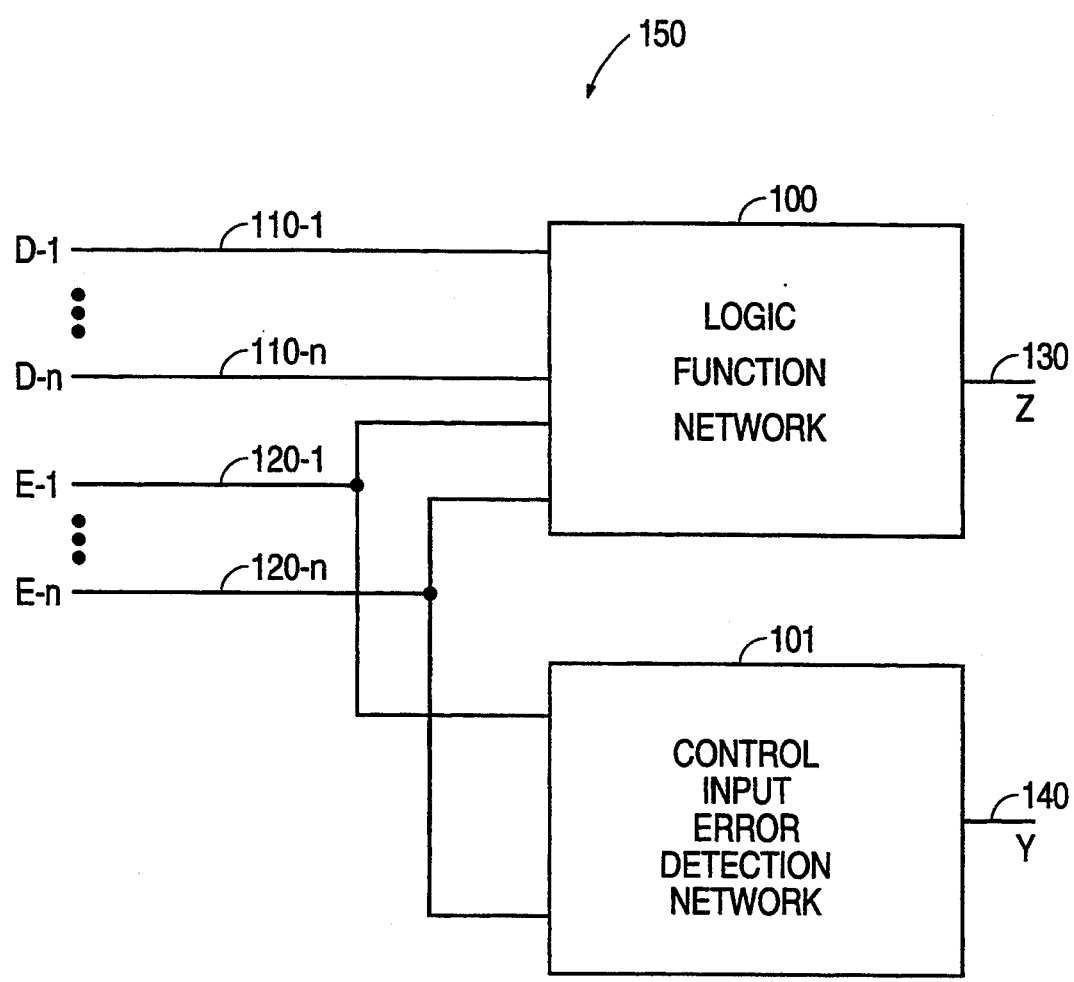
FIG. 3 is a block diagram of the bus structure of this invention.

Structure 150 of this invention is illustrated in FIG. 3. Structure 150 includes two parallel components, logic function means 100 and control input error detection means 101. Both means 100 and 101 are logic networks. Considering three state bus 60 (FIG. 2), both means 100, 101 receive control input signals E-1, . . . , E-n on control input lines 120-1, . . . , 120-n, respectively. However, only means 100 receives data input signals D-1, . . . , D-n on data input lines 110-1 . . . , 110-n, respectively.

Logic function means 100, in response to data input signals D-1, . . . , D-n and control input signals E-1, . . . , E-n generates an output signal Z on output line 130 which is the output signal for three state bus 60 (FIG. 2) for these data and control input signals. Therefore, logic function means 100 simulates digital logic signal propagation through three state bus 60. However, logic function means 100 cannot determine whether bus 60 is floating or alternatively whether contentions exist on bus 60. The allowable levels for output signal Z, i.e., a logic one or zero, do not contain sufficient information to identify these conditions.

Control input error detection means 101, in response to the control input signals, generates an output signal Y on output line 140 which has a first constant predetermined logic level when the control input signals to the three state bus are valid. As used herein, valid control input signals means that the set of control input signals do not result in either contentions or floating of the three state bus. When the control input signals result in either a contention or a floating condition on the three state bus, i.e., the control input signals are invalid, output signal Y has a second constant predetermined logic value. In one embodiment, the first and second constant predetermined logic values are the allowable output signals from the logic primitives available.

Therefore, structure 150 including means 100 and 101 identifies any combination of data input and control input signals, which result in an undesired condition on the three state bus. Accordingly, any test vector that is analyzed using structure 150 of this invention and that produces the first constant predetermined logic level from means 101 is guaranteed not to cause either a contention or floating condition on the three state bus. Unlike most prior art systems, no external or explicit validation of the test vectors using a logic simulator is required when structure of this invention is used to screen test vectors that result in data input and control input signals for three state bus.

Mathematically, the operation of networks 100 and 101 is illustrated by equations 1 and 2:

$$\text{If} \quad E{-}i = 1 \text{ and} \quad \text{(Eq. 1)}$$
$$E{-}j = 0, \text{ for } j \neq i$$
$$\text{then}$$
$$Z = D{-}i \text{ for } i = 1, \ldots, n$$
$$j = 1, \ldots, n; \text{ and}$$

$$\text{If} \quad E{-}i = 1 \text{ and} \quad \text{(Eq. 2)}$$
$$E{-}j = 0, \text{ for } j \neq i$$
$$\text{then}$$
$$Y = 1 \text{ for } i = 1, \ldots, n$$
$$j = 1, \ldots, n;$$
$$\text{otherwise}$$
$$Y = 0.$$

Equations 1 and 2 fully define the operation of logic networks 100 and 101 for control input signals E-1, ..., E-n and data input signals D-1, ..., D-n, as defined above. Of course, equations 1 and 2 assume that a logic one is the active control input signal for the three state element. The operation of networks 100 and 101 can also be defined in terms of a logic zero as the active control input signal for the three state elements.

For equation 1, if both control input signals E-i and E-n are active, i.e. two three state elements in the bus are active, a contention results on the bus. This contention is not detected by logic network 100. However, control input error detection network 101 produces the constant output value of logical one, as represented by Equation 2, when one and only one of the control input signals is active. Therefore, if both control input signals E-i and E-n are active, output signal Y goes to a logic zero value which indicates that there is an unacceptable condition on the three state bus.

Networks 100 and 101 may be used to screen data input and control input signals to the three state bus from any source without using a logic simulation or manual screening. Specifically, any test vector which generates a result other than the first predetermined constant logic output value from network 101 is rejected as an unacceptable test vector.

Typically, in a test generator system within a computer aided design system, test vectors are generated to provide input conditions for a digital circuit design. Since a three state bus is not usually driven directly by input signals to the digital circuit, a portion of the digital circuit processes the test vector input signals and the intermediate signals generated by this portion of the digital circuit provide the data and control input signals to the three state bus. Here, the logic of the portion of the digital circuit that produces the intermediate signals is assumed correct.

The actual configuration of networks 100 and 101 is a function of the primitive logic elements supported by the test pattern generator in which structure 150 is incorporated. In one embodiment, the primitive logic elements are, as described above, AND, OR, NAND, NOR, NOT and buffer. For this set of primitive logic elements and two element three state bus 60A (FIG. 4A), network 100 is illustrated in FIG. 4B, and network 101 is illustrated in FIG. 4C.

Network 100 (FIG. 4B), in this embodiment, includes a first AND gate 200-1 having a control input line 120-1 for control input signal E-1 and a second input line 110-1 for data input signal D-1. A second AND gate 200-2, similar to AND gate 200-1, has a first input line 120-2 for control input signal E-2 and a second input line 110-2 for data input signal D-2. Output line 205-1 of AND gate 200-1 provides a first input signal to OR gate 210 and output line 205-2 of AND gate 200-2 provides a second input signal to OR gate 210. The output signal of OR gate 210 on line 130 is the output signal Z for two element three state bus 60A (FIG. 4A).

Network 101 (FIG. 4B) includes first input line 120-2 for (i) receiving control input signal E-2 and (ii) supplying signal E-2 to a first invertor 300-1 and to a first input line 307-2 of AND gate 310-2. A second input line 120-1 of network 101 receives control input signal E-1 and supplies signal E-1 to a second invertor 300-2 and to a first input line 307-1 of AND gate 310-1. Second input line 305-1 for AND gate 310-1 is connected to the output terminal of invertor 300-1. Similarly, second input line 305-2 for AND gate 310-2 is connected to the output terminal of invertor 300-2. Output line 315-1 of AND gate 310-1 provides a first input signal to OR gate 320 and line 315-2 from AND gate 310-2 provides a second input signal to OR gate 320. Output line 140 of OR gate 320 carries signal Y which indicates whether there is a contention or floating condition on bus 60A (FIG. 4A).

Figure 4A:
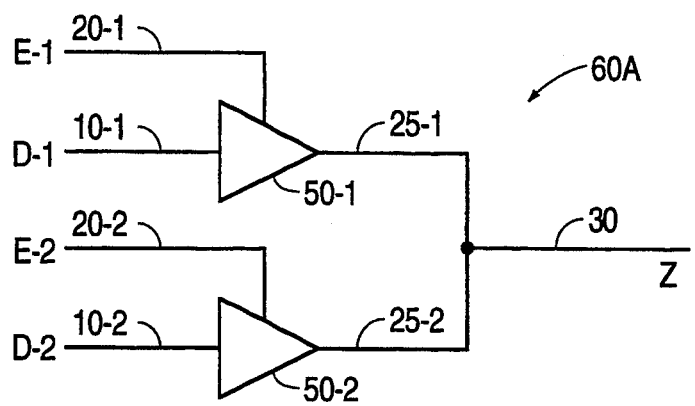
FIG. 4A is a prior art bus consisting of two three state elements.
Figure 4B:
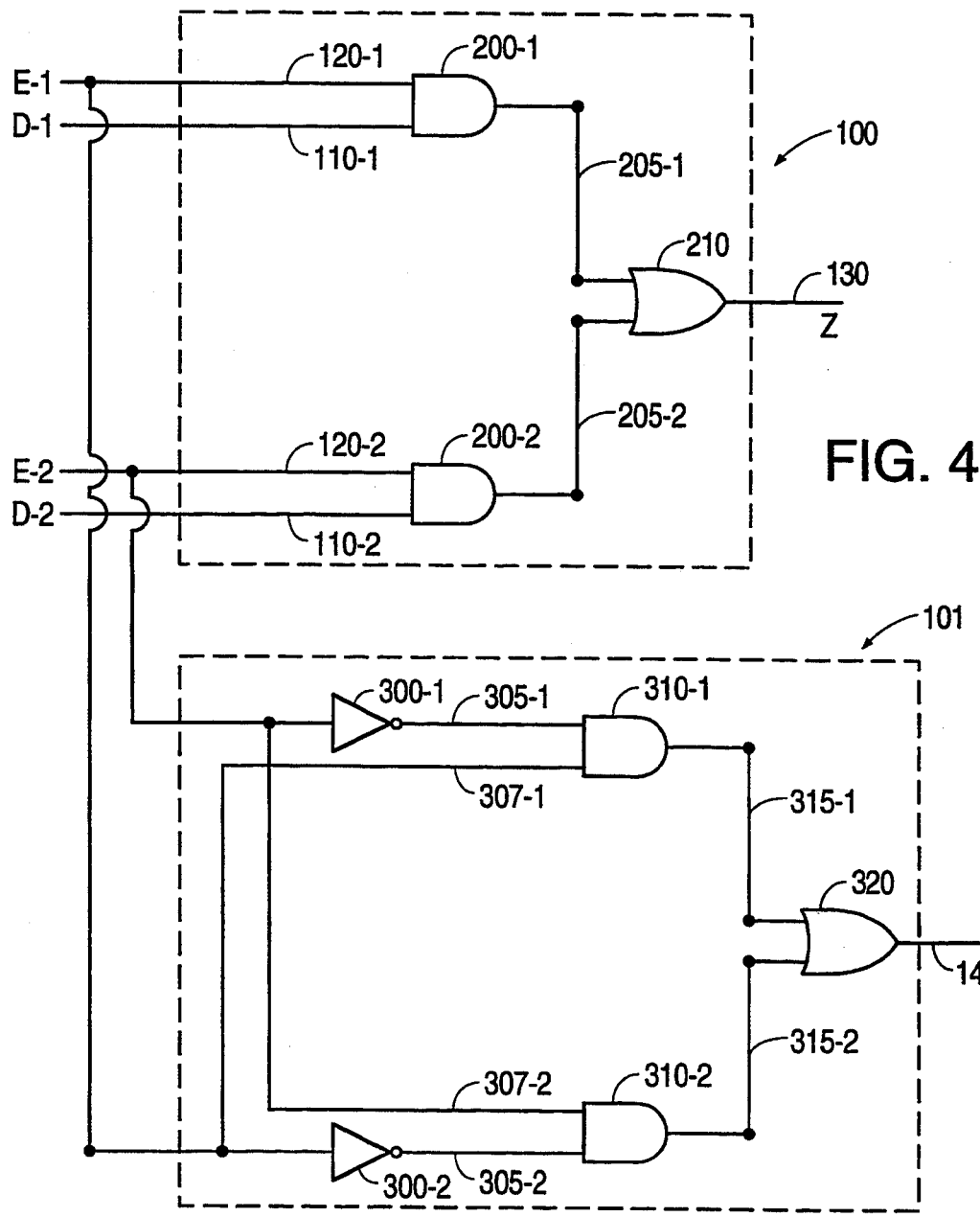
FIG. 4B is a schematic diagram of the logic networks comprising the bus structure of this invention for a two element three state bus.

The operation of structure 150 (FIG. 3) of this invention with networks 100 and 101, as illustrated in FIGS. 4B and 4C respectively, is given in Table 1 for three state elements that are active when the control input signal has a logic one value. The first two columns of Table 1 represent the possible values of control input signals E-1, E-2, respectively. The third column is the value of output signal Z of network 100. Similarly, the fourth column of Table 1 is output signal Y of network 101. Each row of Table 1 gives the control input signals for networks 100 and 101 and the resulting output signals, Z and Y. Control input signals E-1, E-2 are represented by a 0 and a 1. Here, a 0 value is an inactive signal and a value of 1 is an active signal for the three state elements 50-1, 50-2 in three state bus 60A (FIG. 4A).

TABLE 1

| E-1 | E-2 | Z | Y |
|---|---|---|---|
| 0 | 0 | FLOATING | 0 |
| 1 | 0 | D-1 | 1 |
| 0 | 1 | D-2 | 1 |
| 1 | 1 | CONTENTION | 0 |

The operation of AND gates, OR gates and invertors for given input signals are well known to those skilled in the art, so the results given in Table 1 for networks 100 and 101 (FIG. 4B) are not discussed in further detail. The important aspect is that when control input signals are both active or both inactive, which results in an undesirable condition for bus 60A (FIG. 4A), as described previously, output signal Y goes to a logical 0 value. Therefore, according to the principles of this invention, any test vector that results in both control input signals for bus 60A being either active or inactive is rejected and so only valid test vectors remain.

The generalization of networks 100 and 101 from a bus having two three state elements to a bus having n three state elements is straight forward for network 100 where n is a selected integer. Specifically, network 100, using the same logical primitives as for two element bus 60A in FIGS. 4A and 4B, has n AND gates, i.e., a plurality of a first type of primitive logic elements, with each AND gate receiving a control input signal and a data input signal for one of the n three state elements in the bus. The output signals from the n AND gates are input signals to a OR gate, i.e., a second type of a primitive logic element, and the output signal from the OR gate is the bus output signal Z.

Figure 5:
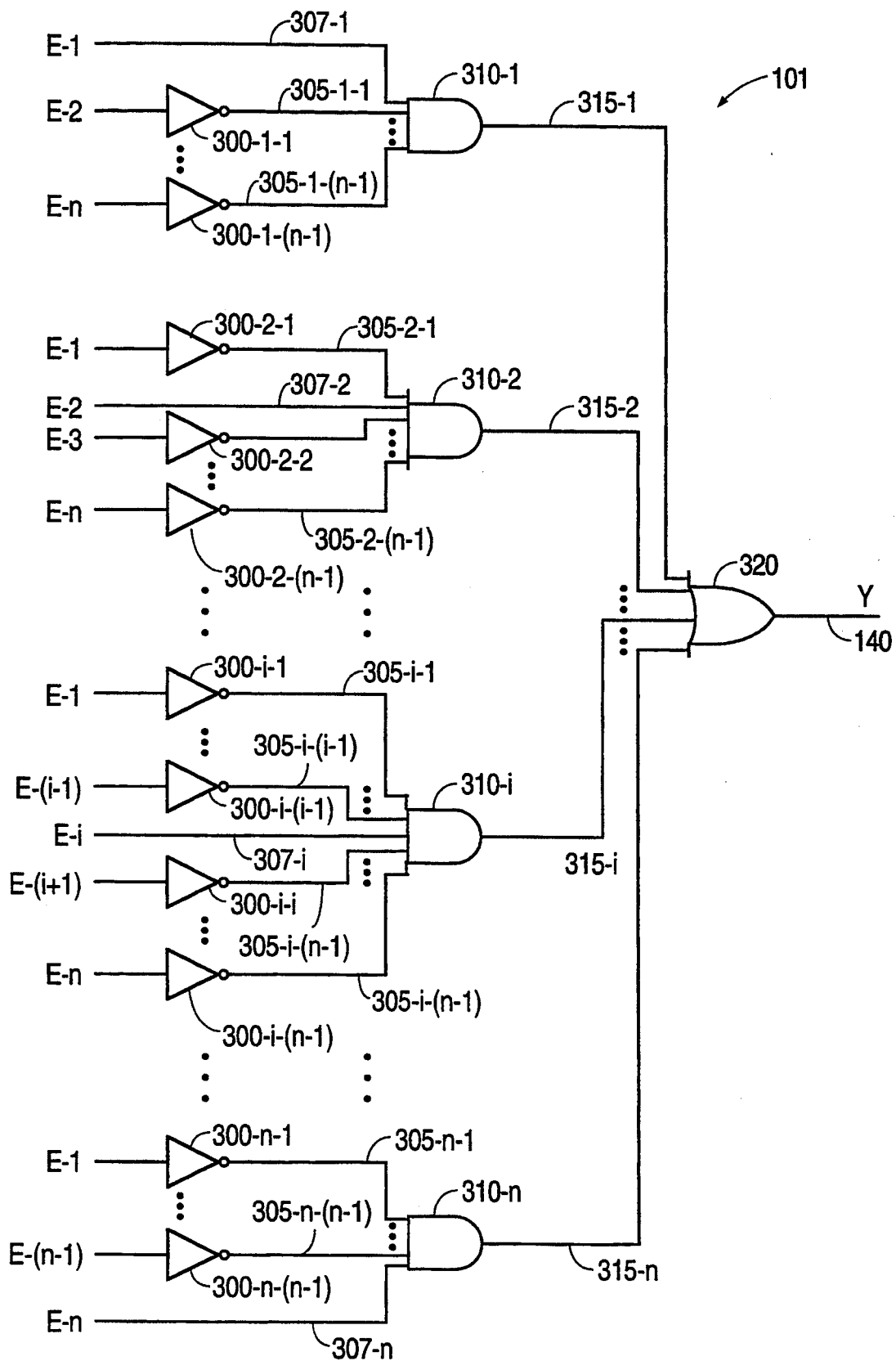
FIG. 5 is a schematic diagram of the control input error detection network of this invention for an N element three state bus.

FIG. 5 illustrates network 101 for an n element three state bus 60 (FIG. 2). Network 101, in this embodiment, includes n AND gates i.e., n primitive logic elements, 310-1, ... 310-n. Each AND gate has n input lines. For the ith AND gate 310-i, as illustrated in FIG. 5, control input signal E-i is provided directly to AND gate 310-i on line 307-i and the inverse of all other control input signals are provided to AND gate 310-i. Therefore, each of the primitive logic elements, i.e., the AND gates in this embodiment, processes n signals where the n signals are associated with, i.e., derived from, the n control input signals for the three state bus. The output signals from the n AND gates drive OR gate 320 and the output signal of OR gate 320 on line 140 is signal Y.

In the above embodiments, primitive logic elements including AND, OR, NAND, NOR, NOT and buffer were used. Alternatively, in view of this disclosure, networks 100 and 101 of this invention may be implemented using another set of primitive logic elements or alternatively the same set of primitive logic elements as above and other gates within the set. For example, the AND gates may be replaced with NOR gates and invertors placed on the appropriate lines or replaced with only NOR gates, as described below, using methods well known to those skilled in the art. Accordingly, the above examples are only illustrative of the principles of this invention and are not intended to limit the invention to either the specific primitive logic elements used or the particular gates used within the networks.

As is apparent from the above description, structure 150 of this invention can be used in any test pattern generation system for digital circuit designs that contain three state buses. However, as described above, network 101 produces a specified constant output signal Y on line 140. Accordingly, the test pattern generation system must support the use of a constant value output at an internal node such as line 140 of network 101. This means that the user can specify to the test pattern generation system that only test vectors producing a specified constant value at a specified internal node are acceptable.

In one embodiment of this invention, structure 150 is programmed in the C computer language, as illustrated in attached Appendix A, which is incorporated herein by reference in its entirety. The C computer program is compiled and linked using the UNIX operating system SUN OS 4.0.3, the compiler, and the linker that are provided with a workstation such as the SUN-4 computer system available from Sun Microsystems of Palo Alto, Calif. The particular computer language and the computer system used are not an essential aspect of this invention. In view of this disclosure, those skilled in the art can implement the invention using a different computer language and/or a different computer system.

In addition to the computer code in Appendix A, additional instructions must be included to define structures 150 within the test pattern generation system. The precise instructions depend on the test pattern generation system used. Typically, the test pattern generation system includes user manuals that define how to specify the digital circuit for which the test vectors are generated. Therefore, in view of the disclosure below, the specific means for including structure 150 in a particular test pattern generation system is known to those skilled in the art.

Figure 6A:
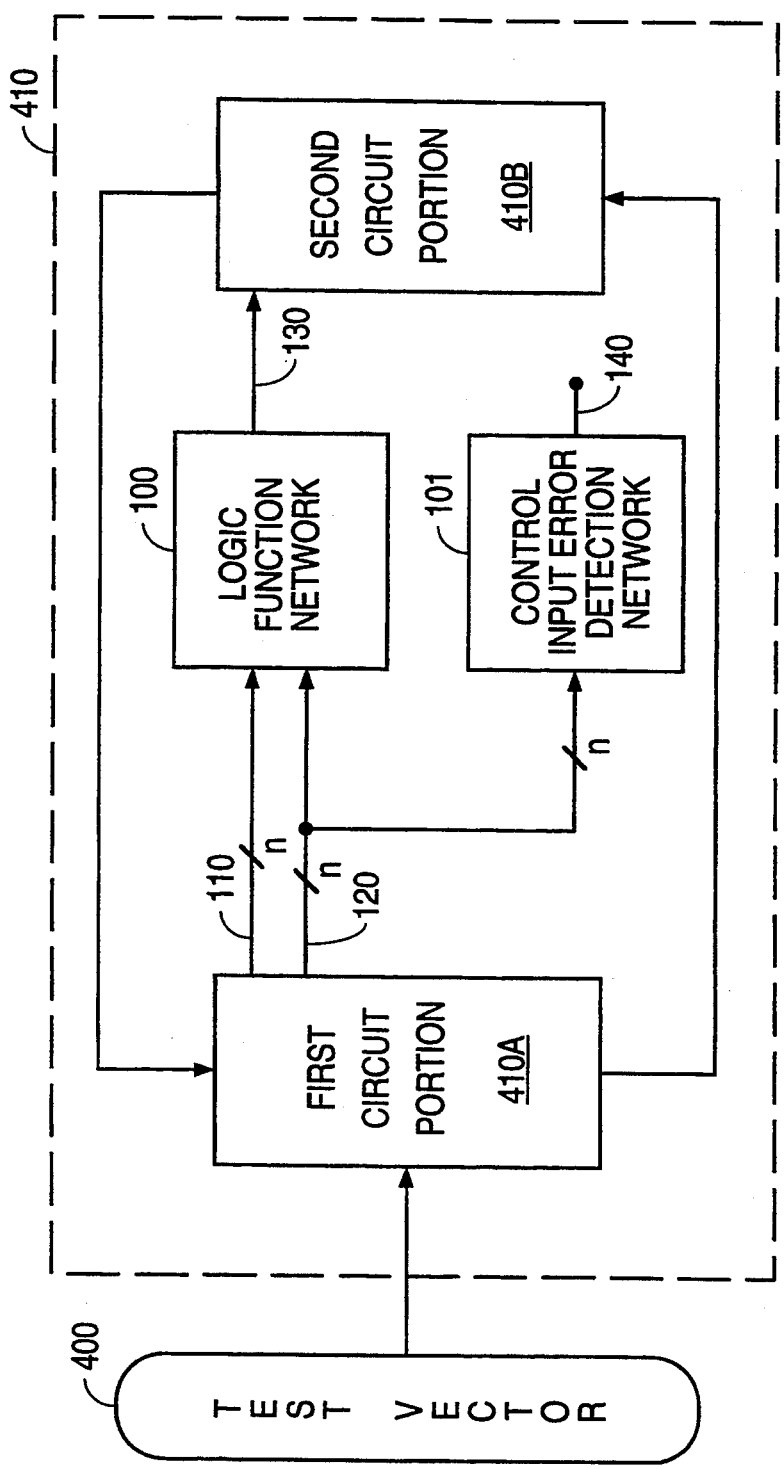
FIG. 6A is a block diagram of a network generated by a test pattern generation system and the test vectors generated by that system.

One embodiment of the use of structure 150 of this invention is illustrated schematically in FIG. 6A. A test pattern generation system (not shown) includes a network for representing digital circuit 410. The network for circuit 410 includes a first portion of logic 410A that provides a plurality of data input signals over a plurality of lines 110 to network 100. Similarly, portion 410A of the network for logic circuit 410 provides a plurality of control signals over a plurality of lines 120 to networks 101 and 100 respectively. The output signal from network 100 on line 130 is provided to a second portion 410B of circuit 410. The output signal on line 140 from network 101 is the constant node output signal that is used to accept and reject test vectors. Portions 410A, 410B communicate with each other as illustrated in FIG. 6A. The designation of portions of network 410 is arbitrary and is intended only to indicate the source of signals for networks 100 and 101 and the receiver of the output signal from network 100. Obviously, portions 410A and 410B may be the same network, i.e. the signal on output line 130 (FIG. 6A) is provided to portion 410A and portion 410B is eliminated from FIG. 6A.

For the purposes of demonstrating the implementation of structure 150 of this invention in the test pattern generator, the network for digital circuit 410 is referred to as the "TPG_NETWORK". Structure 150 including networks 100 and 101 is simply a part of network TPG_NETWORK for the digital circuit for which test vectors 400 are being generated by the test pattern generator.

Figure 6B:
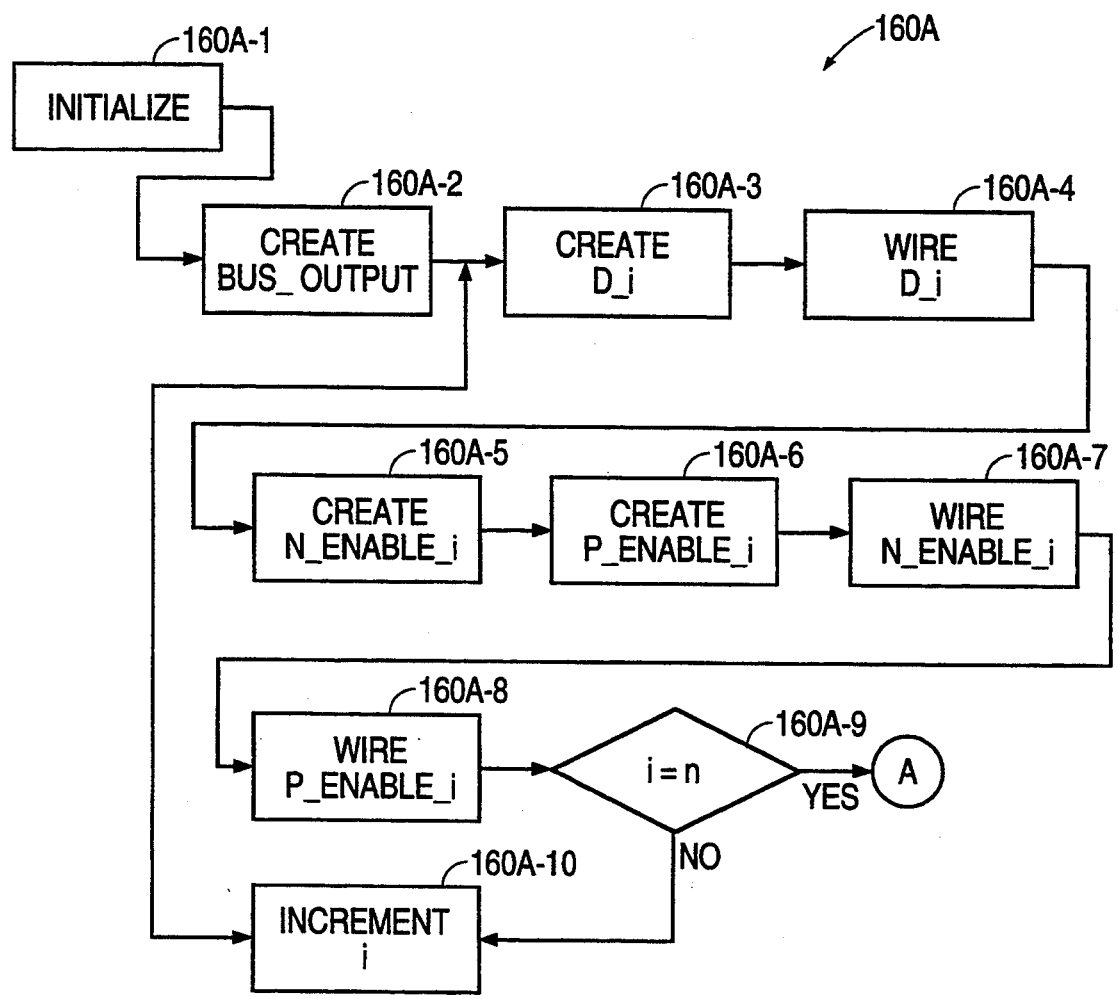
FIG. 6B is a process flow diagram for generating the three state bus simulation means in the test pattern generator network.

In this embodiment, the test pattern generator is based upon NOR logic so only NOR gates are used in building structure 150 (FIG. 3) in the network TPG_NETWORK. Typically, it is preferrable to construct network 150 using the same basic primitive logic elements that are utilized in the test pattern generator. Also, in this embodiment the processes used to build structures 100 and 101 are represented in FIG. 6B as process 160A and in FIG. 6C as process 160B, respectively.

The first step in process 160A is initialization 160A-1. In initialization 160A-1, dynamically dimensioned arrays are created to pass NOR gates P_ENABLE and N_ENABLE, described more completely below, between the two processes of Appendix A. Of course, alternatively, these two processes could be created as a single process and then the dynamically dimensioned arrays are unnecessary. Also, for purposes of this example, a first index variable i is initialized to one and a second index variable k is also initialized to 1.

Create BUS_OUTPUT 160A-2 in process 160A generates a NOR gate BUS_OUTPUT, sometimes referred to as a NOR node, for network 100 in the network TPG_NETWORK of test pattern generator. The output signal from NOR gate BUS_OUTPUT is the output signal for the three state bus.

Subsequently, processing passes to the operations in the loop formed by operations 160A-3 to 160A-10. Specifically, create D_i 160A-3 generates a NOR gate D_i and processing transfers to wire D_i 160A-4 which in turn connects the output terminal of NOR gate D_i to an input terminal of NOR gate BUS_OUTPUT. (Herein, the "i" following an underscore in a gate name represents the current value of loop index i) Next, create N_ENABLE_i 160A-5 and create P_ENABLE_i 160A-6 create NOR gate N_ENABLE_i and NOR gate P_ENABLE_i, respectively.

Wire N_ENABLE_i 160A-7 creates a wire from the output terminal of NOR gate N_ENABLE_i to the input terminal of NOR gate P_ENABLE_i. Similarly, wire P_ENABLE_i 160A-8 connects a wire from the output node of NOR gate P_ENABLE_i to a first input terminal of NOR gate D_i.

NOR gate D_i has a second input terminal which is driven by a data input signal from logic network 410A. The connection of the logic network data input signal to the second input terminal of NOR gate D_i is made by the test pattern generator when network 100 is created by process 160A in the test pattern generator. Similarly, NOR gate N_ENABLE_i is driven by a control input signal, which is also supplied by the test pattern generator.

Figure 6C:
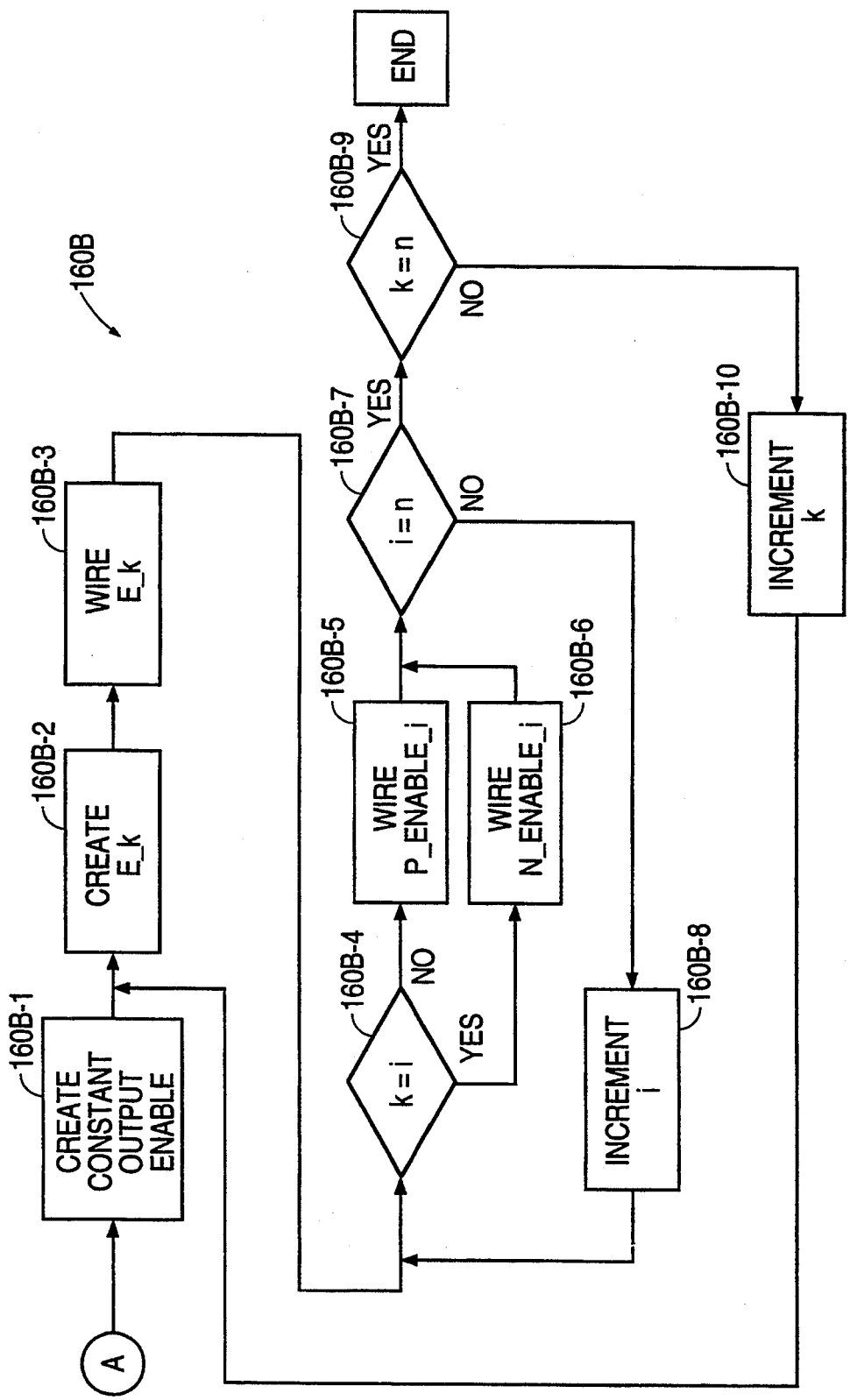
FIG. 6C is a process flow diagram for generating the control input error detection network in the test pattern generator network.

After wire P_ENABLE_i 160A-8 is completed, processing transfers to check (i=n) 160A-9. If i equals the number of three state elements n in the three state bus, processing transfers to process 160B (FIG. 6C). However, if i is less than n, processing transfers to increment i 160A-10 which increases the value of i by one and returns processing to create D_i 160A-3 where processing continues as previously described.

After each of the n three state elements has been represented in structure 100, processing transfers to process 160B which in turn generates network structure 101. In the transfer to process 160B, index i is initialized to one. Process 160B includes an outer loop, as described below, with an index k and an inner loop with an index i. Again, in a gate name, the "i" or "k" following an underscore represents the current value of the associated loop index.

Create constant output ENABLE 160B-1 in process 160B generates a NOR gate ENABLE for structure 101 in the network TPG_NETWORK of the test pattern generator. The output signal of NOR gate ENABLE is specified to be zero for all valid test vectors 400. Thus, the output signal of NOR gate enable is the signal level used to determine whether contentions or floating exists on the three state bus.

Subsequently, create E_k 160B-2 generates a NOR gate E_k in network TPG_NETWORK for structure 101. Wire E_k 160B-3 connects the output terminal of NOR gate E_k to an input terminal of NOR gate ENABLE. Check (k=i) 160B-4 determines whether outer loop index k is equal to inner loop index i. If k is not equal to i, processing transfers to wire P_ENABLE_i 160B-5 which in turn connects the output terminal of NOR gate P_ENABLE_i in structure 100 to another input terminal of NOR gate E_k. Check (i=n) 160B-7 ascertains whether the inner loop index i is equal to the number of three state elements n.

If i is not equal to n, processing transfers to increment i 160B-8 which in turn increases the value of the inner loop index i by one. Check (k=i) 160B-4 again compares the inner loop index i with the outer loop index k. If k should equal i, processing transfers to wire N_ENABLE_i 160B-6, which in turn connects the output terminal of NOR gate N_ENABLE_i in structure 100 to another input terminal of NOR gate E_k.

Processing continues through the inner loop including check 160B-4, operations 160B-5 and 160B-6, check 160B-7 and increment 160B-8 until n input connections have been made to NOR gate E_k. After the n connections are made, processing transfers to check (k=n) 160B-9 which in turn transfers processing to increment k 160B-10 unless index k is equal to the number of three state elements n.

After increment k 160B-8 increases the outer loop index k and resets inner loop index i to one, the loop consisting of operations 160B-2 through 160B-10 is again repeated to create the next element in structure 101. When k=n, check 160B-9 passes processing to end which terminates the generation of structures 100 and 101 in the test pattern generation system.

After the creation of the networks 100 and 101 within the network TPG_NETWORK for digital circuit 410, the test pattern generator connects networks 100 and 101 to network TPG_NETWORK using techniques known to those skilled in the art. After completion of network TPG_NETWORK, the test pattern generator sequentially generates a series of test vectors 400. Only those test vectors that result in the constant output signal of a logic zero on line 140 are generated. This ensures that invalid test vectors are not generated.

Therefore, structure 150 guarantees that test vectors 400 will not cause contention or floating of the three state bus. Thus, the test vectors are always valid and require neither external nor explicit validation of the test vectors using an external logic simulator.

As previously described, the structure 150 of this invention is operative in any test pattern generation system that can support a constant output signal at an internal node. Moreover, the inclusion of a specific structure, such as structure 150, within a test pattern generation network is well known to those skilled in the art.

In addition to structure 150, according to the principles of this invention, a method is provided for a digital circuit including a three state bus to identify data input and control input signals, derived from a test vector, for the three state bus, that result in either a contention on or floating (contention/floating) of the three state bus. The first step in the method is to simulate digital logic signal propagation through the three state bus and generate the output signal of the three state bus for the given data input and control input signals. However, as explained above, this output signal does not contain sufficient information to determine whether the three state bus is floating or has contentions.

The second step in the method detects either contentions on the three state bus or floating of the three state bus by generating, in response to the digital control input signals, a signal having (i) a first constant logic value in the absence of contentions/floating of the bus and (ii) a second constant logic value in the presence of contentions/floating of the bus.

In a more general sense, according to the principles of this invention, in the first step of the method the control input and data input signals for the three state bus are used to generate a first bit of data that represents the output signal of the three state bus, while in the second step of the method, the control signals are used to generate a second bit of data that represents acceptable and unacceptable states of the three state bus. Using this method, the test vectors that result in the data input and control input signals, are screened so that only valid test vectors are accepted, i.e. those test vectors that generate valid control input signals, which in turn generate the acceptable state of the second data bit.

In one embodiment, the simulating step includes generating a logic network representing the three state bus using primitive logical elements. Similarly, the detecting step includes generating a logic network that in response to the control input signals has the first constant logic value output signal when contention/floating of the bus is not present and the second constant logic value output signal when contention/floating is present.

The embodiments of this invention are illustrative only and are not intended to limit the invention to the particular embodiments described. In view of this disclosure, other applications and embodiments of both the structure and method will be apparent to those skilled in the art.

APPENDIX A

```
/*******************************************************************
   FUNCTION: dctpg_model_ts_bus                    AUTHOR: Tony Ma ABSTRACT: Create the model for a tristate-bus and tristate-elements and
             inout ports that drive it.

Copyright 1990 Synopsys Inc., all rights reserved.
 *******************************************************************/
static void
dctpg_model_ts_bus(dctpg, net, bus_output, pos_bus_enable, neg_bus_enable,
    /*ts_inout_to_out, ts_inout_to_enable, ts_inout_to_in,*/ pin_to_node_table,
    /* fault_ref_table,*/ model_enable_logic /*, pin_htable */)
dctpg_t *dctpg;
dc_net net;
tpg_node_t **bus_output, **pos_bus_enable, **neg_bus_enable;
/* st_table *ts_inout_to_out, *ts_inout_to_enable, *ts_inout_to_in; */
st_table *pin_to_node_table;
/* st_table *fault_ref_table; */
int model_enable_logic;
/* hash_table pin_htable; */
{
    array_t *pos_enable, *neg_enable;
    tpg_node_t *node, *zero_node;
    tpg_node_t *p_enable, *n_enable;
    int i, j;

*bus_output = tpg_create_nor_node(dctpg->tpg);
    pos_enable = array_alloc(tpg_node_t *, 0);
    neg_enable = array_alloc(tpg_node_t *, 0);
    dctpg_model_tristate_cell(dctpg, net, *bus_output, pos_enable,
        neg_enable, pin_to_node_table);
    /*dctpg_model_tristate_inout(dctpg, net, *bus_output, pos_enable,
        neg_enable, ts_inout_to_out, ts_inout_to_enable, ts_inout_to_in,
        fault_ref_table, pin_htable);*/
    if (model_enable_logic) {
        zero_node = tpg_create_constant_node(dctpg->tpg, 0);
        for (i = 0; i < array_n(pos_enable); i++) {
            node = tpg_create_nor_node(dctpg->tpg);
            (void) tpg_create_edge(node, zero_node);
            for (j = 0; j < array_n(neg_enable); j++) {
                if (i == j) {
                    p_enable = array_fetch(tpg_node_t *, pos_enable, j);
```

```
                (void) tpg_create_edge(p_enable, node);
            } else {
                n_enable = array_fetch(tpg_node_t *, neg_enable, j);
                (void) tpg_create_edge(n_enable, node);
            }
        }
    }
} else {
    *pos_bus_enable = array_fetch(tpg_node_t *, pos_enable, 0);
    *neg_bus_enable = array_fetch(tpg_node_t *, neg_enable, 0);
}
array_free(pos_enable);
array_free(neg_enable);
} static void
dctpg_model_tristate_cell(dctpg, net, bus_output, pos_enable, neg_enable,
    pin_to_node_table)
dctpg_t *dctpg;
dc_net net;
tpg_node_t *bus_output;
array_t *pos_enable, *neg_enable;
st_table *pin_to_node_table;
{
    tpg_node_t *output_node, *n_enable, *p_enable;
    dc_cell cell;
    dc_pin dout_pin, pin;

dc_for_all_global_pins_of_net(net, dout_pin, DC_OUT) {
        cell = dout_pin->cell;
        if (tlib_cell_is_tristate(cell)) {
            output_node = tpg_create_nor_node(dctpg->tpg);
            dctpg_store_pin_to_node_ref(pin_to_node_table, dout_pin,
                output_node);
            (void) tpg_create_edge(output_node, bus_output);
            dc_for_all_pins_of_cell(cell, pin, DC_IN) {
                if (tlib_pin_is_tristated_on(pin)) {
                    n_enable = tpg_create_nor_node(dctpg->tpg);
                    (void) array_insert_last(tpg_node_t *, neg_enable,
                        n_enable);
                    dctpg_store_pin_to_node_ref(pin_to_node_table, pin,
                        n_enable);
                    p_enable = tpg_create_nor_node(dctpg->tpg);
                    (void) array_insert_last(tpg_node_t *, pos_enable,
                        p_enable);
                    (void) tpg_create_edge(n_enable, p_enable);
                    (void) tpg_create_edge(p_enable, output_node);
                } else if (tlib_pin_is_tristate_input(pin)) {
                    dctpg_store_pin_to_node_ref(pin_to_node_table, pin,
                        output_node);
                }
            } dc_end_for;
        } else {
            fail("Development error: non-tristate cell drives tristate-bus");
        }
    } dc_end_for;
}
```

I claim:

1. A structure for identifying digital circuit data input and control input signals to a three state bus that result in either contentions or floating of said three state bus, said structure comprising:

means, responsive to said three state bus data input and control input signals, for simulating digital logic signal propagation through said three state bus wherein the output signal of said simulating means is the response of said three state bus to said three state bus data input and control input signals; and means, responsive to said control input signals, for (i) detecting contentions on said three state bus and (ii)

detecting floating of said three state bus;

wherein the output signal of said detecting means has (i) a first constant predetermined logic value in the absence of a contention on and floating of said three state bus and (ii) a second constant predetermined logic value in the presence of each condition in the group of conditions consisting of contentions on and floating of said three state bus thereby identifying the digital circuit control input signals that result in contentions and floating.

2. A structure as in claim 1 wherein said simulation means comprises a plurality of primitive logic elements.

3. A structure as in claim 2 wherein said three state bus includes a plurality of three state elements and each three state element is represented in said simulation means by at least one primitive logic element in said plurality of primitive logic elements, and further wherein said at least one primitive logic element receives signals corresponding to the data input signal and the control input signal for the three state element represented by said at least one primitive logic element.

4. A structure as in claim 1 wherein said detecting means comprises a plurality of primitive logic elements.

5. A structure as in claim 4 wherein the three state bus includes n three state elements and further wherein said plurality of primitive logic elements comprise at least n primitive logic elements wherein each of said at least n primitive logic elements processes n signals where the n signals are associated with the n control input signals for the n element three state bus.

6. A method for evaluating digital circuit data input and control input signals for a three state bus comprising the steps of:

simulating digital logic signal propagation through said three state bus to generate an output signal for said three state bus for said data input and control input signals;

detecting contentions on said three state bus and detecting floating of said three state bus by generating, in response to the control input signals, a signal having (i) a first constant predetermined value in the absence of contentions on and floating of said three state bus and (ii) a second constant predetermined value in the presence of each condition in the group of conditions consisting of contentions on and floating of said three state bus.

7. The method of claim 6 wherein the simulating step further comprises generating a logic network wherein the logic network receives said data input and control input signals and in response to these signals generates said three state bus output signal.

8. The method of claim 7 wherein the logic network generating step further comprises generating a plurality of primitive logic elements wherein each primitive logic element processes the control and data input signals for a three state element in said three state bus.

9. The method of claim 6 wherein the detecting contentions and floating step further comprises generating a logic network wherein the logic network receives said control input signals and generates, in turn, one of (i) said signal having a first constant predetermined value and (ii) said signal having said second constant predetermined value.

10. The method of claim 9 wherein the logic network generating step further comprises generating a plurality of primitive logic elements wherein each primitive logic element processes signals associated with the control input signals to the three state bus.

* * * * *